United States Patent
Hatano et al.

(10) Patent No.: US 8,040,205 B2
(45) Date of Patent: Oct. 18, 2011

(54) DUPLEXER HAVING SPECIFIED RELATIONSHIP OF THE MINIMUM DISTANCES BETWEEN SIGNAL PADS AND SPECIFIC GROUND PADS

(75) Inventors: Koichi Hatano, Yokohama (JP); Jun Tsutsumi, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 296 days.

(21) Appl. No.: 12/481,069

(22) Filed: Jun. 9, 2009

(65) Prior Publication Data

US 2009/0302970 A1    Dec. 10, 2009

(30) Foreign Application Priority Data

Jun. 9, 2008    (JP) ................. 2008-150383

(51) Int. Cl.
H03H 9/70 (2006.01)
H03H 9/72 (2006.01)
(52) U.S. Cl. .................. 333/133; 333/193; 333/189
(58) Field of Classification Search .................. 333/133, 333/187–196
See application file for complete search history.

(56) References Cited

U.S. PATENT DOCUMENTS

| 7,884,686 | B2* | 2/2011 | Pitschi et al. | 333/133 |
| 2007/0069834 | A1* | 3/2007 | Ikuta et al. | 333/133 |

FOREIGN PATENT DOCUMENTS

| JP | 2002-076829 A | 3/2002 |
| JP | 2006-060747 A | 3/2006 |

* cited by examiner

*Primary Examiner* — Barbara Summons
(74) *Attorney, Agent, or Firm* — Arent Fox LLP

(57) ABSTRACT

A duplexer includes a substrate including an insulation layer, an upper interconnection layer provided on an upper surface of the insulation layer, a lower interconnection layer provided on a lower surface of the insulation layer, and an inner interconnection layer provided in the insulation layer, the inner interconnection layer including an inner ground pad, at least one acoustic wave filter chip mounted on an upper surface of the substrate, signal pads provided on the upper interconnection layer and connected to signal electrodes of the at least one acoustic wave filter chip, and an upper ground pad that is provided in the upper interconnection layer so as to be located between the signal pads and is connected to a ground electrode of the at least one acoustic wave filter, wherein $D1>D2$ and $D1>T1$ where $D1$ is a minimum distance between the signal pads and the upper ground pad, $D2$ is a minimum distance between the signal pads and the inner ground pad, and $T1$ is a thickness of the insulation layer between the upper interconnection layer and the inner interconnection layer.

9 Claims, 20 Drawing Sheets

DUPLEXER HAVING SPECIFIED RELATIONSHIP OF THE MINIMUM DISTANCES BETWEEN SIGNAL PADS AND SPECIFIC GROUND PADS

CROSS-REFERENCE TO RELATED APPLICATION

This application is based upon and claims the benefit of priority of the prior Japanese Patent Application No. 2008-150383, filed on Jun. 9, 2008, the entire contents of which are incorporated herein by reference.

FIELD

A certain aspect of embodiments discussed herein relates to a duplexer.

BACKGROUND

Recent development of information-oriented society has popularized mobile communication equipment such as portable phones and portable information terminals. The portable phones use an RF band such as a 800 MHz-1.0 GHz band and 1.5 GHz-2.0 GHz band. Accordingly, a duplexer that utilizes an acoustic wave such as a surface acoustic wave filter (SAW filter) or a film-bulk acoustic resonator (FBAR) are used. It is also considered to use another type of duplexer using a boundary acoustic wave filter.

The recent portable phones have progressed to multiple bands and multiple modes, and are further equipped with an additional radio interface such as wireless LAN or GPS. In the above situation, the duplexer is demanded to have improvements in size and performance. Particularly, the duplexer is desired to achieve both downsizing and reliable isolation between pads.

There is proposal to provide a shield electrode between patterns of multiple SAW filters and to thus improve the isolation characteristics (see Japanese Laid-Open Patent Publication No. 2006-60747). There is another proposal to prevent interference between signals by arranging input and output terminals for making external connections so as to diagonally connect corners of the shape of a device having multiple filter elements (see Japanese Laid-Open Patent Publication No. 2002-76829).

SUMMARY

According to an aspect of the present invention, there is provided a duplexer includes a substrate including an insulation layer, an upper interconnection layer provided on an upper surface of the insulation layer, a lower interconnection layer provided on a lower surface of the insulation layer, and an inner interconnection layer provided in the insulation layer, the inner interconnection layer including an inner ground pad, at least one acoustic wave filter chip mounted on an upper surface of the substrate, signal pads provided on the upper interconnection layer and connected to signal electrodes of the at least one acoustic wave filter chip, and an upper ground pad that is provided in the upper interconnection layer so as to be located between the signal pads and is connected to a ground electrode of the at least one acoustic wave filter, wherein $D1>D2$ and $D1>T1$ where $D1$ is a minimum distance between the signal pads and the upper ground pad, $D2$ is a minimum distance between the signal pads and the inner ground pad, and $T1$ is a thickness of the insulation layer between the upper interconnection layer and the inner interconnection layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
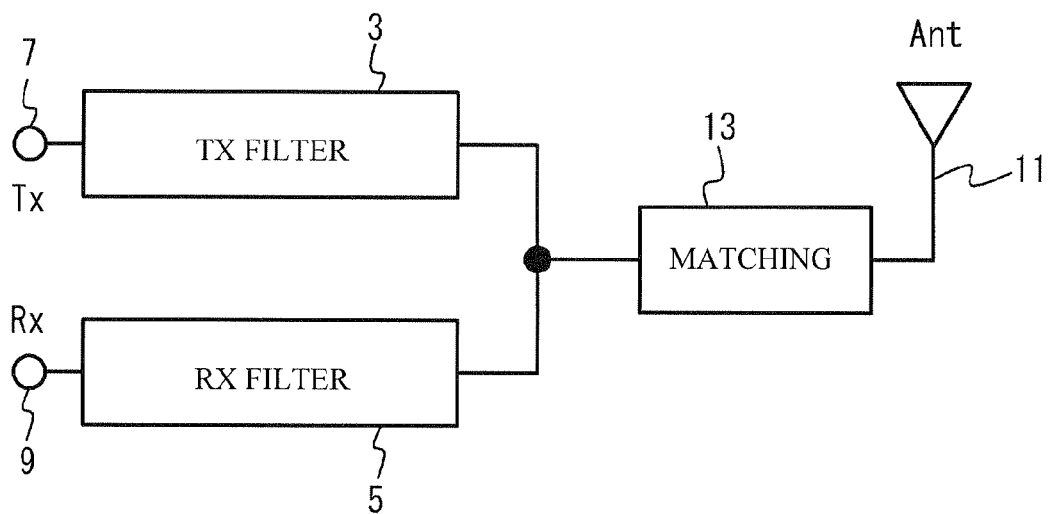
FIGS. 1A and 1B are respectively block diagrams of duplexers.
Figure 1B:
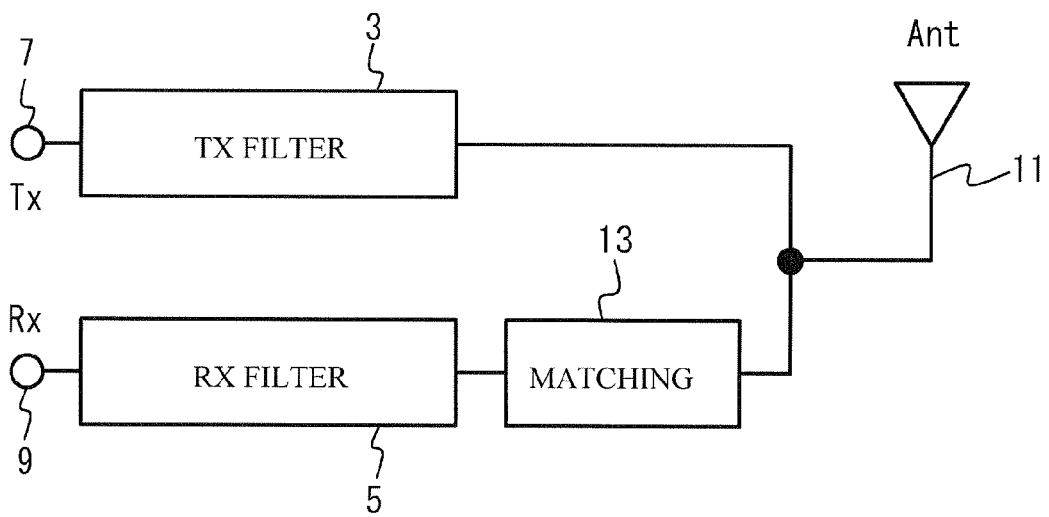

First, a description is given of arts related to aspects of embodiments described hereinafter. FIGS. 1A and 1B are block diagrams of duplexers. Referring to FIG. 1A, an acoustic wave filter 3 for transmission (transmission filter) is connected to a transmission node 7, and an acoustic wave filter 5 for reception (reception filter) is connected to a reception node 9. The transmission filter 3 and the reception filter 5 are coupled to an antenna 11 (Ant) via a matching circuit 13. The structure may be modified, as illustrated in FIG. 1B, in which only the reception filter 5 may be coupled to the antenna 11 via the matching circuit 13. Although not illustrated, only the transmission filter 3 may be coupled to the antenna 11 via the matching circuit 13. That is, at least one of the transmission filter 3 and the reception filter 5 is coupled to the antenna 11 via the matching circuit 13.

The transmission filter 3 and the reception filter 5 have mutually different pass bands. Due to the function of the matching circuit 13, the reception filter 5 has a higher impedance than the antenna 11 in the transmission band, and the transmission filer 3 has a higher impedance than the antenna 11 in the reception band. It is thus possible to prevent the transmission signal from being input to the reception side and to prevent the reception signal from being input to the transmission side.

Figure 2:
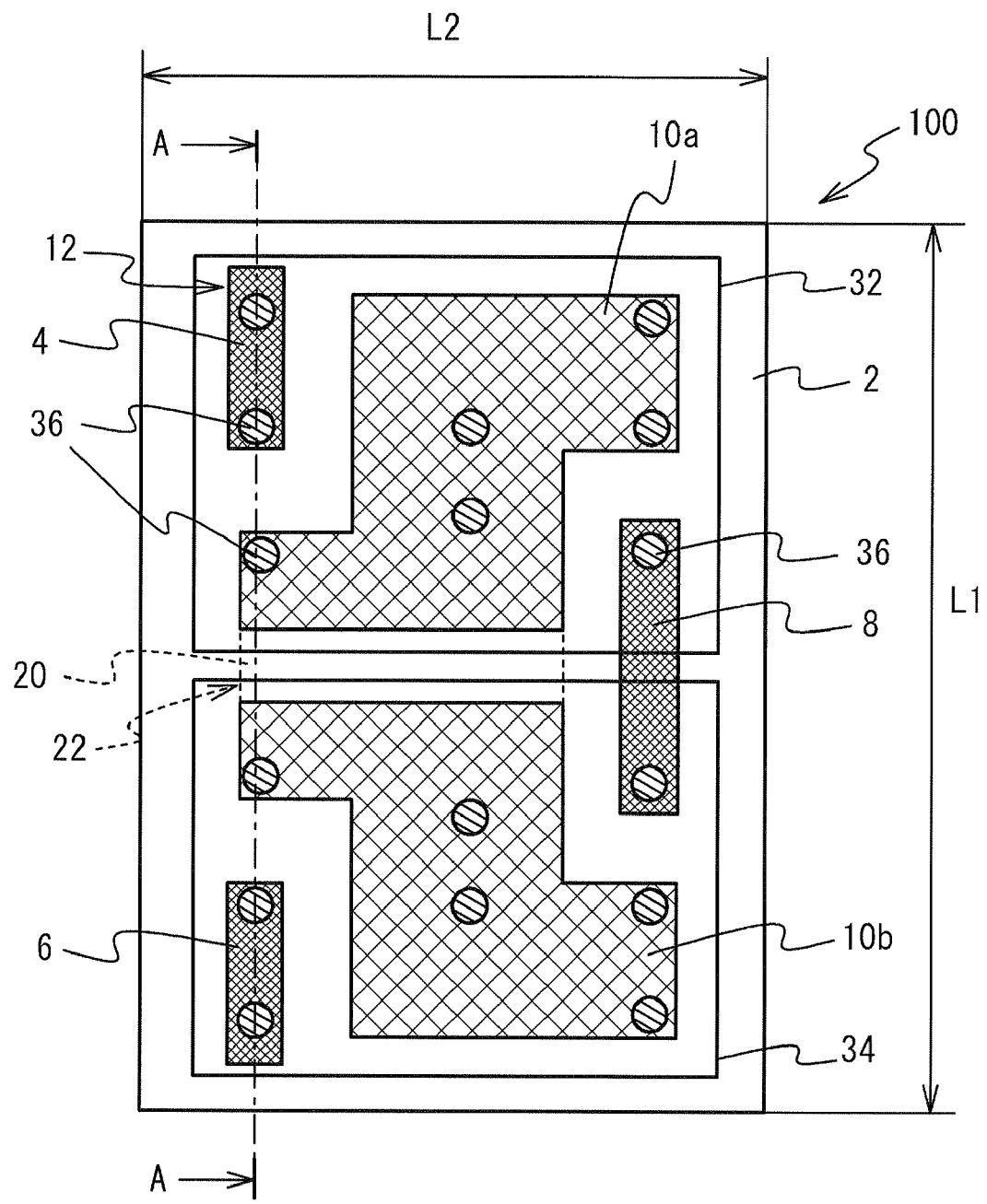
FIG. 2 is a plan view of a duplexer related to an aspect of embodiments of the present invention.
Figure 3:
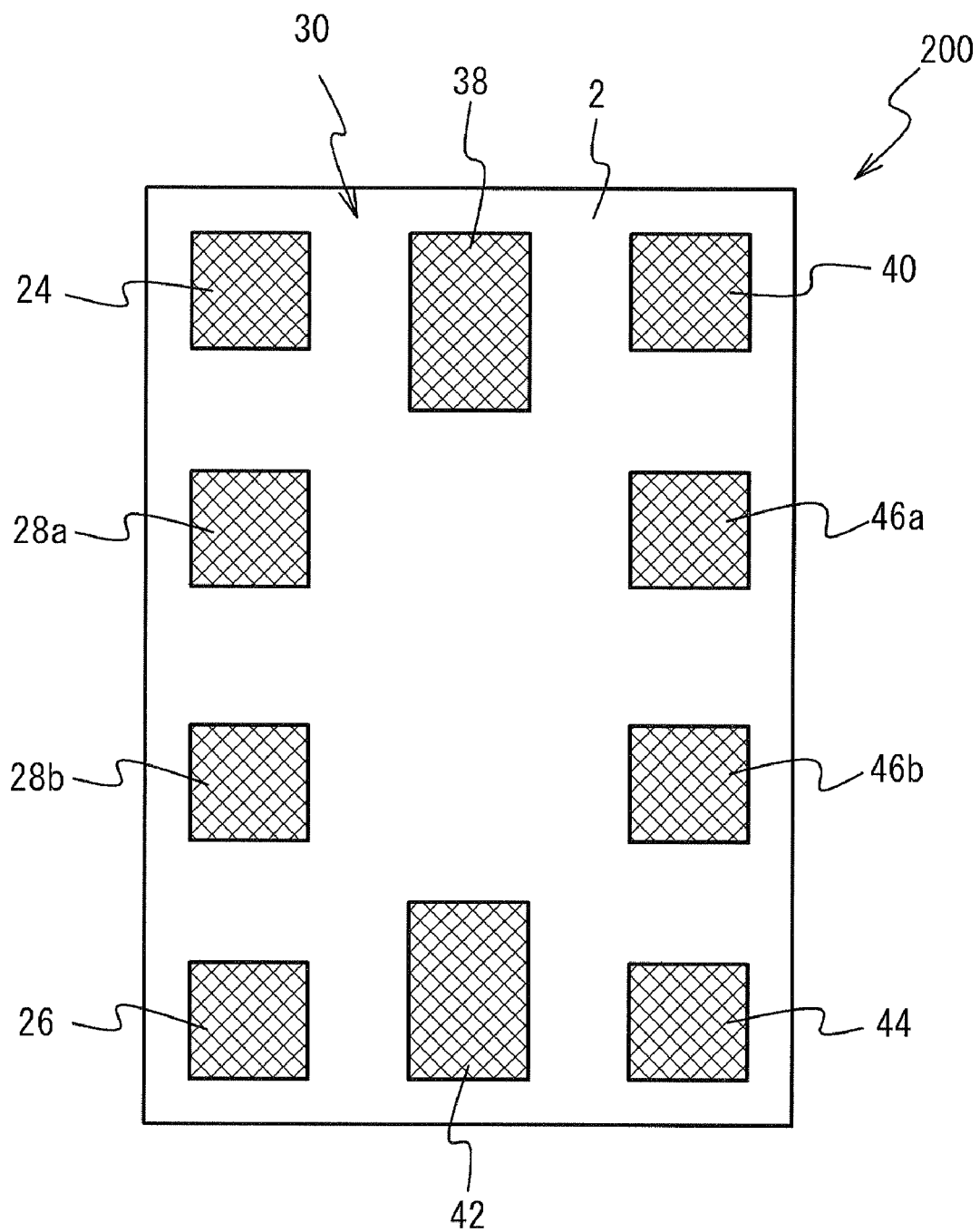
FIG. 3 is a plan view of an inner interconnection layer of the duplexer illustrated in FIG. 2.
Figure 4:
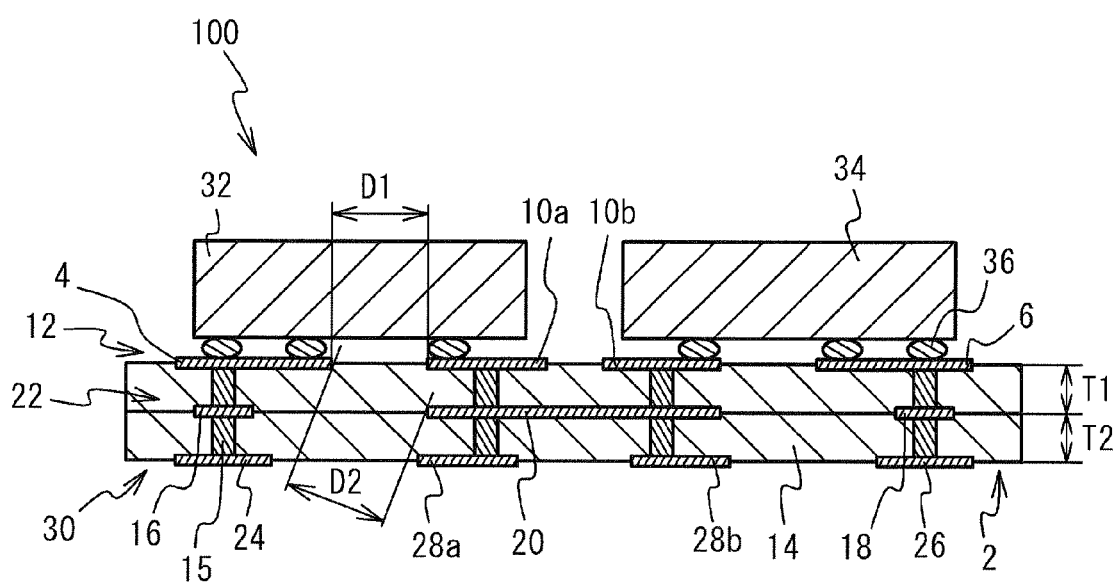
FIG. 4 is a cross-sectional view of the duplexer.

FIG. 2 is a plan view of a duplexer 100 having an acoustic wave filter chip 32 for transmission and an acoustic wave filter chip 34 for reception. Only the outer shapes of the chips 32 and 34 are illustrated by solid lines, and the insides thereof are seen through. FIG. 3 is a plan view of the duplexer 100 in which only a lower interconnection layer 30 is illustrated while the transmission filter chip 32, an insulation layer 14, the reception filter chip 34, an upper interconnection layer 12 and an inner interconnection layer 22 are seen through. FIG. 4 is a cross-sectional view taken along a line A-A illustrated in FIG. 2.

As illustrated in FIGS. 2 and 4, a substrate 2 is composed of the insulation layer 14, the upper interconnection layer 12, the lower interconnection layer 30, and the inner interconnection layer 22. The insulation layer 14 may be made of an insulator such as aluminum ceramic. The upper interconnection layer 12 is provided on an upper surface of the insulation layer 14. The lower interconnection layer 30 is provided on a lower surface of the insulation layer 14. The inter interconnection layer 22 is provided within the insulation layer 14. The upper interconnection layer 12, the lower interconnection layer 30 and the inner interconnection layer 22 may be made of a metal such as W or Al. For example, the upper interconnection layer 12 may be 10-15 µm thick, and the inner interconnection layer 22 may be 7-10 µm thick. For example, the substrate 2 has a longitudinal length L1 of 2.5 mm, and a lateral length L2 of 2.0 mm. In the upper interconnection layer 12, provided are a transmission pad 4, a reception pad 6, a common terminal 8, and upper ground pads 10a and 10b. The pads 4 and 6 are signal pads. The upper ground pads 10a and 10b are provided between the transmission pad 4 and the reception pad 6. The transmission filter chip 32 and the reception filter chip 34 are mounted on the upper surface of the substrate 2 using bumps made of a metal such as solder. This will be described in detail later. A portion indicated by dotted lines in FIG. 2 is an inner ground pad 20 of the inner interconnection layer 22.

As illustrated in FIG. 3, in the lower interconnection layer 30, provided are a transmission pad 24, a reception pad 26, lower ground pads 28a, 28b, 38, 40, 42 and 44, and common terminals 46a and 46b. These pads and terminals function as terminals for making external connections. The common terminals 46a and 46b are connected to the antenna. At least one of the common terminal 46a connected to the transmission filter chip 32 and the common terminal 46b connected to the reception filter chip 34 is coupled to the antenna 11 via the matching circuit 13 (see FIGS. 1A and 1B).

As depicted in FIG. 4, in the inner interconnection layer 22, provided are a transmission pad 16, a reception pad 18, the inner ground pad 20, and a common terminal (not illustrated for the sake of simplicity). The upper interconnection layer 12, the inner interconnection layer 22 and the lower interconnection layer 30 are connected by vias 15 (not illustrated in FIG. 2).

As illustrated in FIGS. 2 and 4, the transmission pad 4 in the upper interconnection layer 12 is connected to a transmission electrode (not illustrated) of the transmission filter chip 32 via bumps 36, and the reception pad 6 is connected to a reception electrode (not illustrated) of the reception filter chip 34 via bumps 36. The common terminal 8 is connected to a common electrode (not illustrated) for the transmission filter chip 32 and the reception filter chip 34 via bumps 36.

For example, the transmission filter chip 32 may be a ladder type SAW filter, and the reception filter chip 34 may be a double-mode SAW filter. The transmission filter chip 32 and the reception filter chip 34 have mutually different pass bands.

An end of the inner ground pad 20 is located just below the upper ground pads 10a and 10b. Now, D1 is defined as the minimum distance between the transmission pad 4 and the upper ground pad 10a and the minimum distance between the reception pad 6 and the upper ground pad 10b. That is, D1 is the minimum distance between the signal pads and the upper ground pads. Further, D2 is defined as the minimum distance between the transmission pad 4 and the inner ground pad 20 and the minimum distance between the reception pad 6 and the inner ground pad 20. That is, D2 is the minimum distance between the signal pads and the inner ground pad. As illustrated, D2 is greater than D1 (D2>D1).

The downsizing of the duplexer reduces the distance between the signal pads. This may cause signal leakage resulting from a coupling between signals on the signal pads and may degrade the isolation between the signal pads. Referring to FIGS. 2 and 4, the distance between the transmission pad 4 and the reception pad 6 is reduced to, for example, 0.7-1.0 mm, and signal leakage between the transmission pad 4 and the reception pad 6 is caused. Thus, the isolation between the pads 4 and 6 is degraded.

According to an aspect of embodiments described hereinafter, there is provided a duplexer having improved isolation between signal pads. Thus, the duplexer may be downsized while satisfactory isolation between the signal pads is kept.

A description will now be given of embodiments of the invention with reference to the accompanying drawings.

First Embodiment

Figure 5:
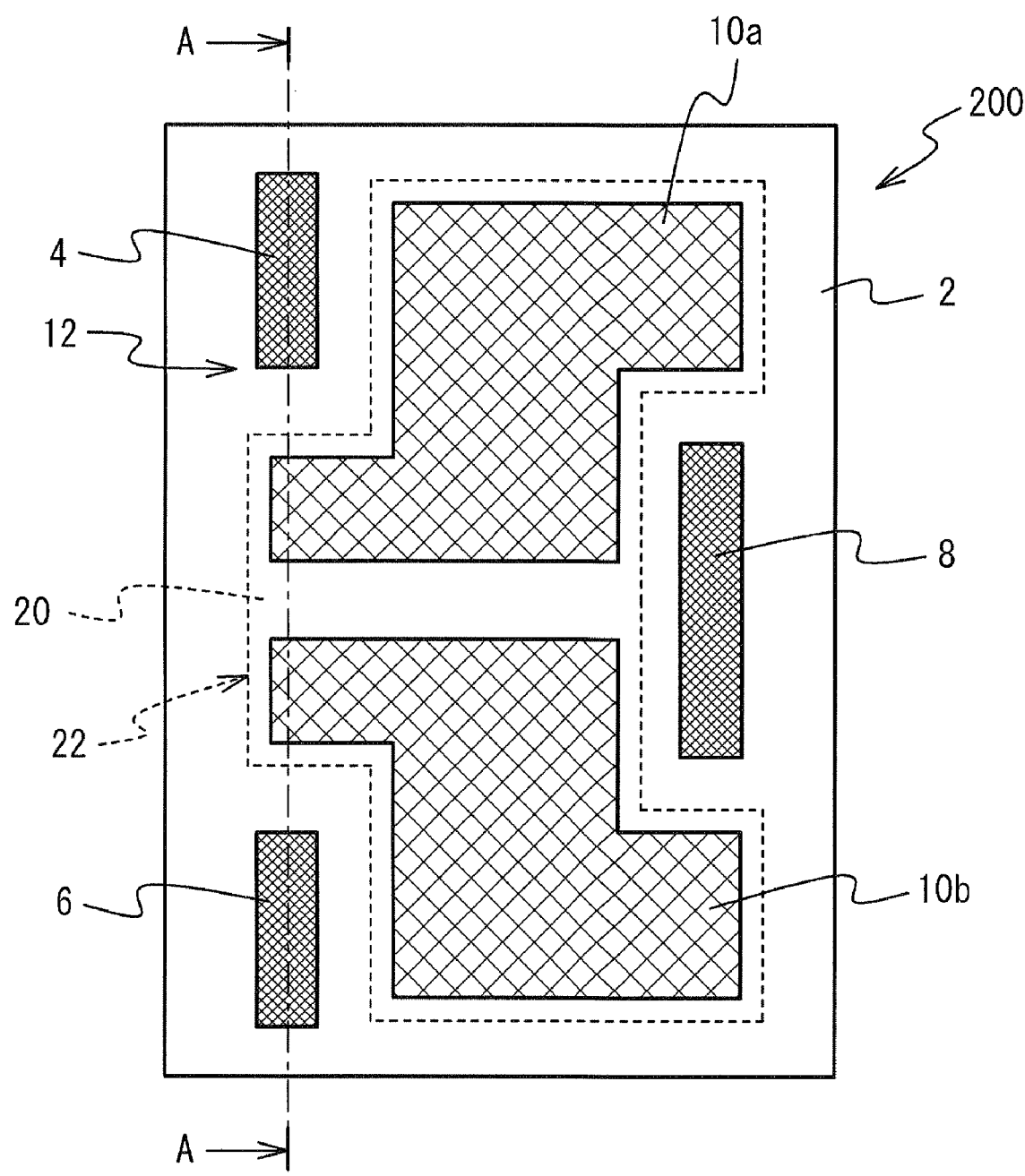
FIG. 5 is a plan view of a duplexer in accordance with a first embodiment.
Figure 6:
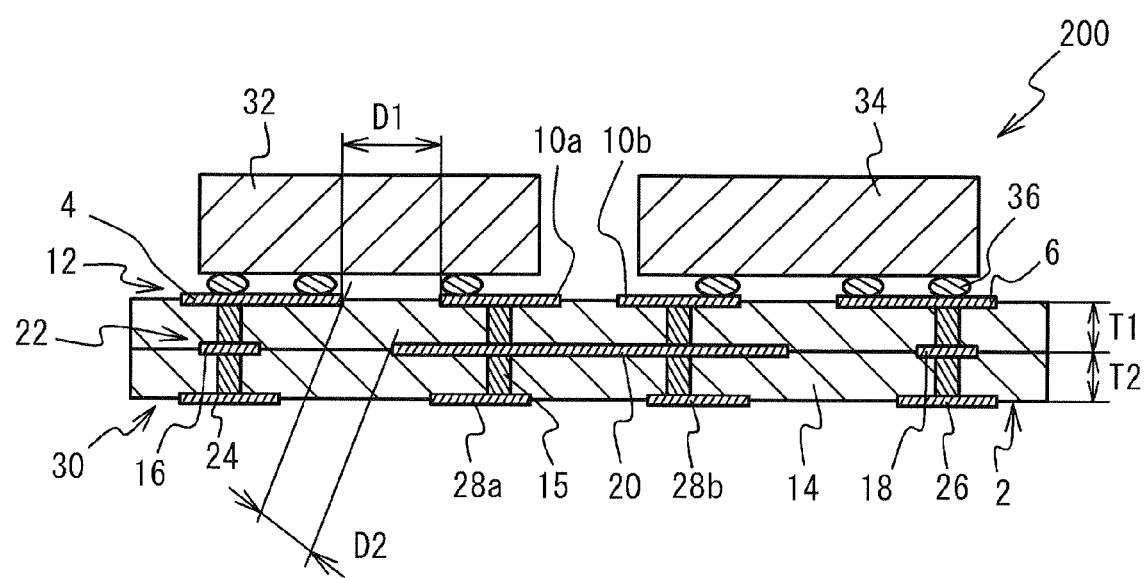
FIG. 6 is a cross-sectional view of the duplexer in accordance with the first embodiment.

FIG. 5 is a plan view of a duplexer 200 in accordance with a first embodiment, and FIG. 6 is a cross-sectional view taken along a line A-A illustrated in FIG. 5. In FIG. 5, the transmission filter chip 32, the reception filter chip 34, the vias 15 and bumps are not illustrated for the sake of simplicity (this holds true for FIGS. 10, 12 and 14). In FIG. 6, T1 indicates the thickness of the insulation layer 14 between the center of the upper interconnection layer 12 and the center of the inner interconnection layer 22 for the convenience' sake. However, more strictly, T1 denotes the thickness of the insulation layer 14 between the lower surface of the upper interconnection layer 12 and the upper surface of the inner interconnection layer 22 (this holds true for FIGS. 4, 7, 8, 9, 13, 16, 19 and 20). A description of the structural elements that have been described is omitted here.

As illustrated in FIGS. 5 and 6, the inner ground pad 20 is greater than that illustrated in FIGS. 2 and 3. Thus, the duplexer 200 has a reduced minimum distance D2 between the transmission pad 4 and the inner ground pad 2 and between the reception pad 6 and the inner ground pad 20. That is, the minimum distance D2 between the signal pads and the inner ground pad 20 is reduced so that D1>D2. It is thus possible to strengthen the signal coupling between the transmission pad 4 and the inner ground pad 20 and the signal coupling between the reception pad 6 and the inner ground pad 20, as compared to the related art.

Now, D1>T1 where T1 denotes the thickness of the insulation layer 14 between the upper interconnection layer 12 and the inner interconnection layer 22. A symbol T2 denotes the thickness of the insulation layer 14 between the inner interconnection layer 22 and the lower interconnection layer 30. T2 may be equal to T1. Since D1>T1, it is possible to further strengthen the signal coupling between the transmission pad 4 and the inner ground pad 20 and the signal coupling between the reception pad 6 and the inner ground pad 20.

According to the first embodiment, D1>D2 and D1>T1. It is thus possible to strengthen the signal coupling between the transmission pad 4 and the inner ground pad 20 and the signal coupling between the reception pad 6 and the inner ground pad 20. It is thus possible to reduce the signal leakage between the signal on the transmission pad 4 and the signal on the reception pad 6, even when the distance between the transmission pad 4 and the reception pad 6 is reduced to, for example, 0.7-1.0 mm. This makes it possible to downsize the duplexer while keeping the good isolation between the signal pads.

Figure 7:
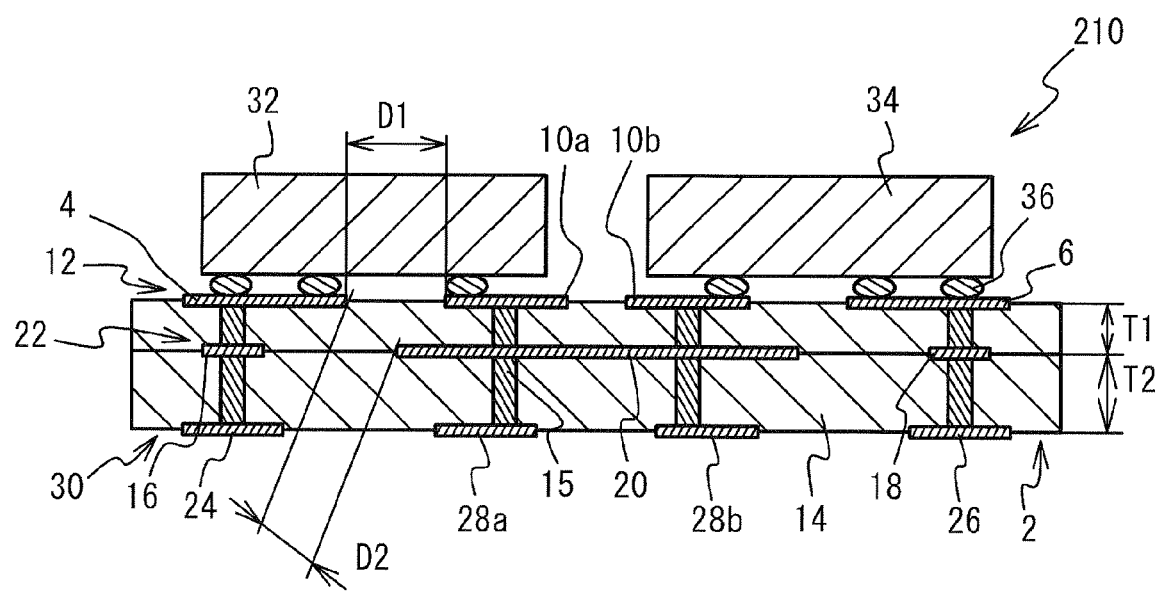
FIG. 7 is a cross-sectional view of a duplexer in accordance with a variation of the first embodiment.

T1 and T2 may be different from each other. A description will now be given of a variation of the first embodiment in which T1 and T2 are different from each other. FIG. 7 is a cross-sectional view of a duplexer 210 in accordance with a variation as described above.

As illustrated in FIG. 7, since D1>D2 and D1>T1, the isolation between the signal pads can be improved, as in the case of FIG. 6. Further, T1 is less than T2. The increase in T2 increases the thickness of the duplexer 210. It is thus possible to improve the strengthen the duplexer 210.

Second Embodiment

Figure 8:
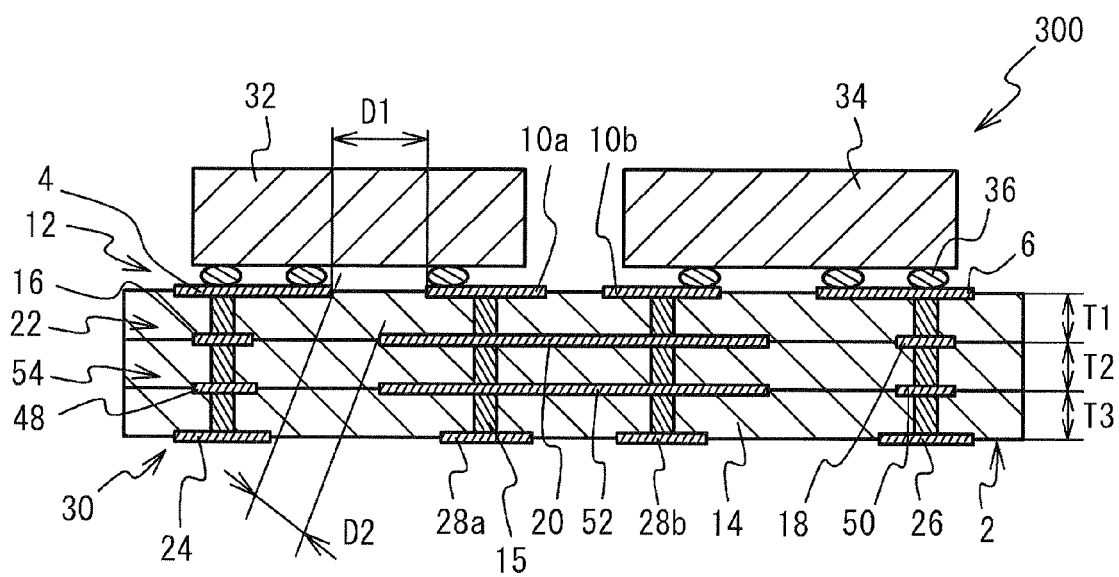
FIG. 8 is a cross-sectional view of a duplexer in accordance with a second embodiment.

A second embodiment has an exemplary structure in which another inner interconnection layer is provided within the substrate 2. FIG. 8 is a cross-sectional view of a duplexer 300 in accordance with the second embodiment.

As illustrated in FIG. 8, there is provided another inner interconnection layer 54 between the inner interconnection layer 22 and the lower interconnection layer 30 of the substrate 2. In the inner interconnection layer 54, provided are a transmission pad 48, a reception pad 50 and an inner ground pad 52. For example, the inner interconnection layer 54 may be 7-10 μm thick. The upper interconnection layer 12, the inner interconnection layers 22 and 54 and the lower interconnection layer 30 are connected by the vias 15. In the second embodiment, T1=T2=T3 where T3 denotes the thickness of the insulation layer 14 between the inner interconnection layer 54 and the lower interconnection layer 30. Further, D1>D2 and D1>T1 as in the case of the first embodiment. In FIG. 8, for the convenience' sake, T2 is illustrated so as to indicate the thickness of the insulation layer 14 between the center of the inner interconnection layer 22 and the center of the inner interconnection layer 54. In actuality, T2 indicates the lower surface of the inner interconnection layer 22 and the upper surface of the inner interconnection layer 54 (this holds true for FIGS. 9 and 13).

According to the second embodiment, it is possible to increase the thickness of the duplexer 300 by employing multiple inner interconnection layers. The duplexer 300 thus configured has increased strength. Further, the duplexer 300 has improved isolation between the signal pads since D1>D2 and D1>T1.

Figure 9:
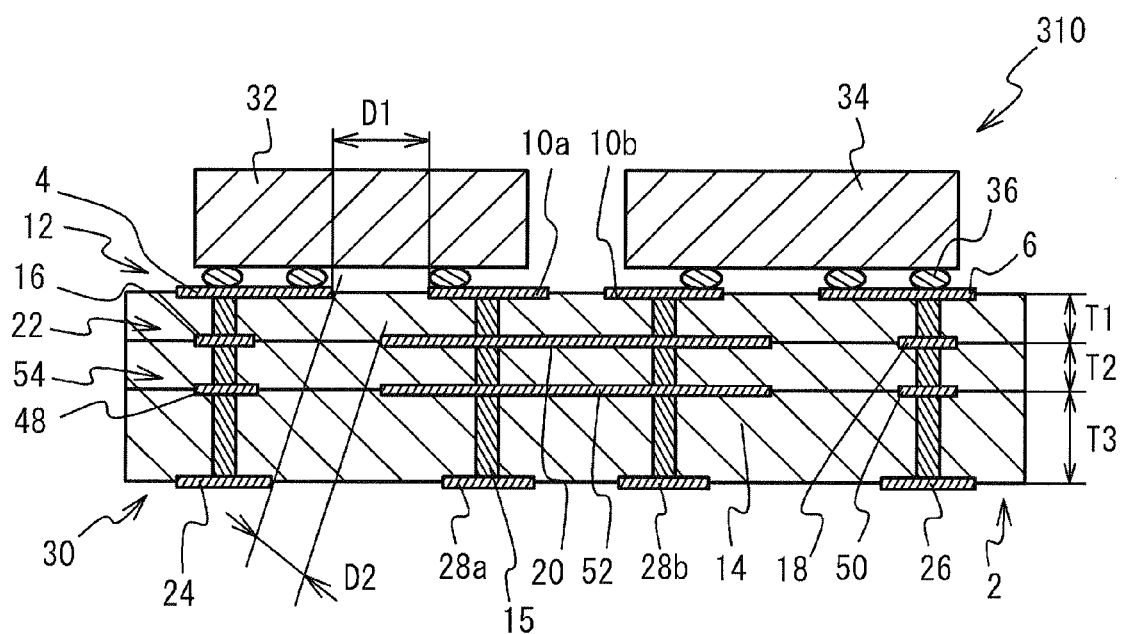
FIG. 9 is a cross-sectional view of a duplexer in accordance with a variation of the second embodiment.

A description will now be given of a variation of the second embodiment in which the variation meets a condition other than T1=T2=T3. FIG. 9 is a cross-sectional view of a duplexer 310 in accordance with this variation of the second embodiment.

As illustrated in FIG. 9, T1 is equal to T2, and T3 is greater than T1 and T2. It is thus possible to increase the thickness of the duplexer 310 and improve the strength thereof. These advantages may be obtained in such a manner that at least one of T1, T2 and T3 may be different from the others.

The inner interconnection layer 22 and the inner interconnection layer 54 may have an identical shape or different shapes. It is possible to provide one or more inner interconnection layers 54 between the inner interconnection layer 22 and the lower interconnection layer 30.

Third Embodiment

Figure 10:
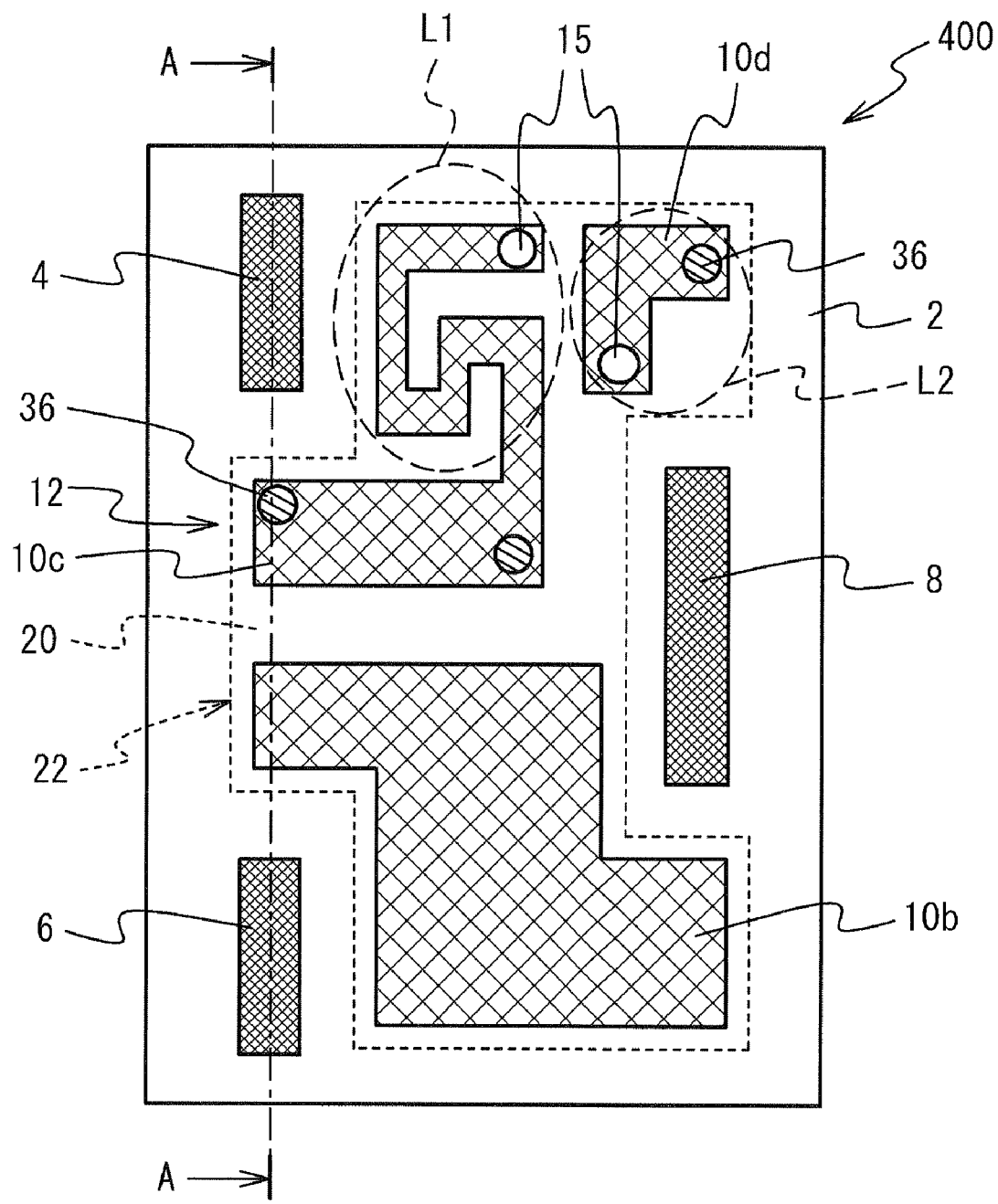
FIG. 10 is a plan view of a duplexer in accordance with a third embodiment.

A third embodiment has an exemplary structure in which an interconnection pattern functioning as an inductance is formed on the upper interconnection layer 12. FIG. 10 is a plan view of a duplexer 400 in accordance with the third embodiment, and FIG. 11 is a circuit diagram of the transmission filter chip 32 employed in the duplexer 400.

Referring to FIG. 10, interconnection patterns L1 and L2 functioning as inductors are respectively provided in upper ground pads 10c and 10d on the upper interconnection layer 12 to which pads the transmission filter chip 32 is connected. Vias 15 are provided in the interconnection patterns L1 and L2. The transmission filter chip 32 is connected to the upper ground pads 10c and 10d via bumps 36, and are further connected to the lower ground pad 28a (see FIG. 3) through the vias 15. That is, the transmission filter chip 32 is grounded via the interconnection patterns L1 and L2. For the convenience' sake, FIG. 10 does not illustrate the bumps 36 connected to the transmission pad 4, the reception pad 6, the common terminal 8 and the upper ground pad 10b.

Figure 11:
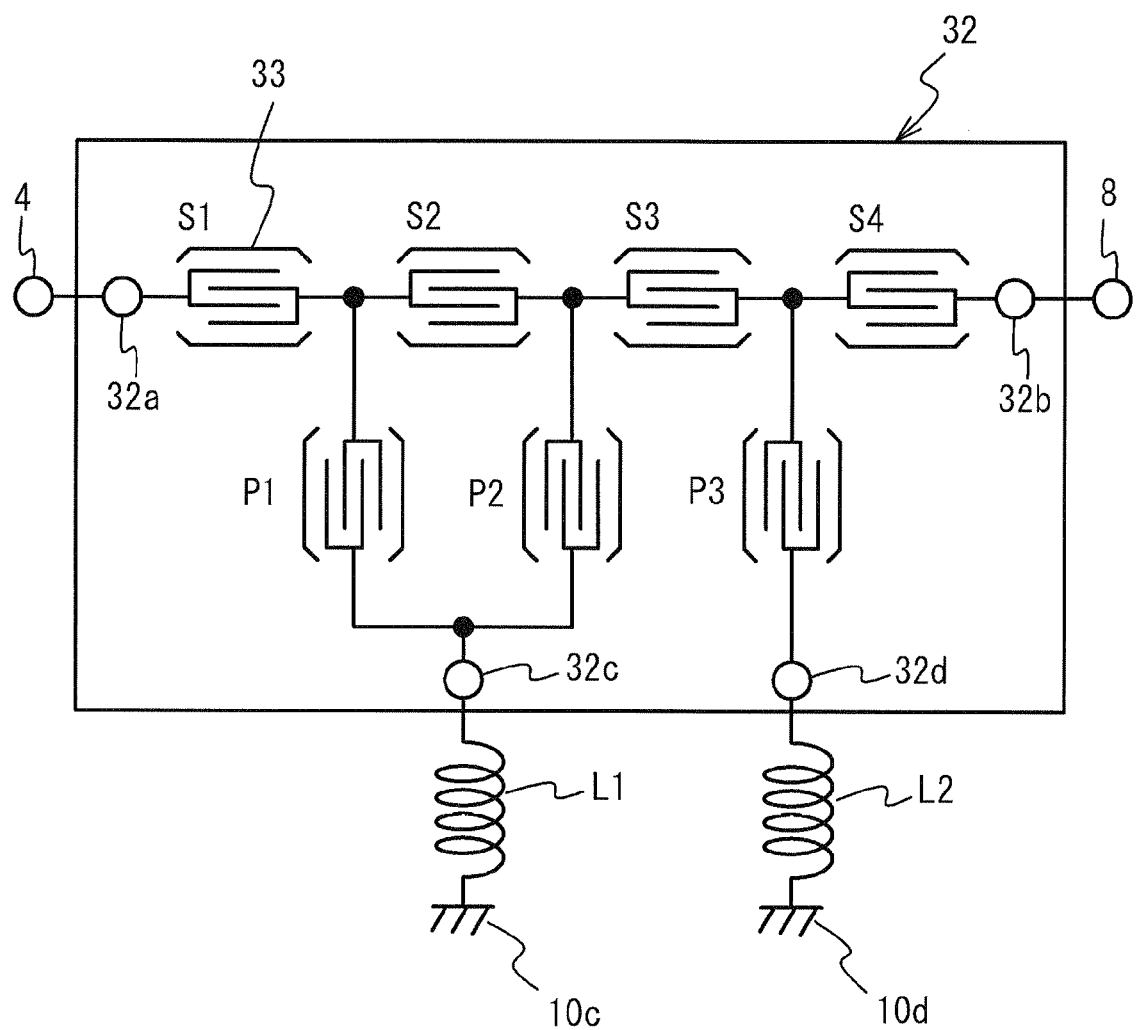
FIG. 11 is a circuit diagram of an acoustic wave filter chip 32 used for transmission provided in the duplexer employed in the fourth embodiment.

As illustrated in FIG. 11, the transmission filter chip 32 may be, for example, a ladder type SAW filter chip equipped with multiple acoustic wave resonators 33. The transmission pad 4 and a transmission electrode 32a of the transmission filter chip 32 are connected via a bump (not illustrated). Similarly, the common terminal 8 and a common electrode 32b are connected via a bump, and the upper ground pad 10c and a ground electrode 32c are connected via a bump. Further, the upper ground pad 10d and a ground electrode 32d are connected via a bump. The multiple resonators 33 are arranged so that resonators S1, S2, S3 and S4 are connected in series, and resonators P1, P2 and P3 are connected in parallel. An inductor L1 (which corresponds to the interconnection pattern L1 in FIG. 10) is inserted between the parallel resonators P1 and P2 and the upper ground pad 10c. An inductor L2 (which corresponds to the interconnection pattern L2) is inserted between the parallel resonator P3 and the upper ground pad 10d. According to the third embodiment, the transmission filter chip 32 are grounded via the inductors L1 and L2.

The interconnections patterns respectively functioning as inductors may be connected to the reception filter chip 34. The number of interconnection patterns respectively functioning as inductors is not limited to two but may be changed in terms of the configuration of the filter chip to be mounted.

Fourth Embodiment

Figure 12:
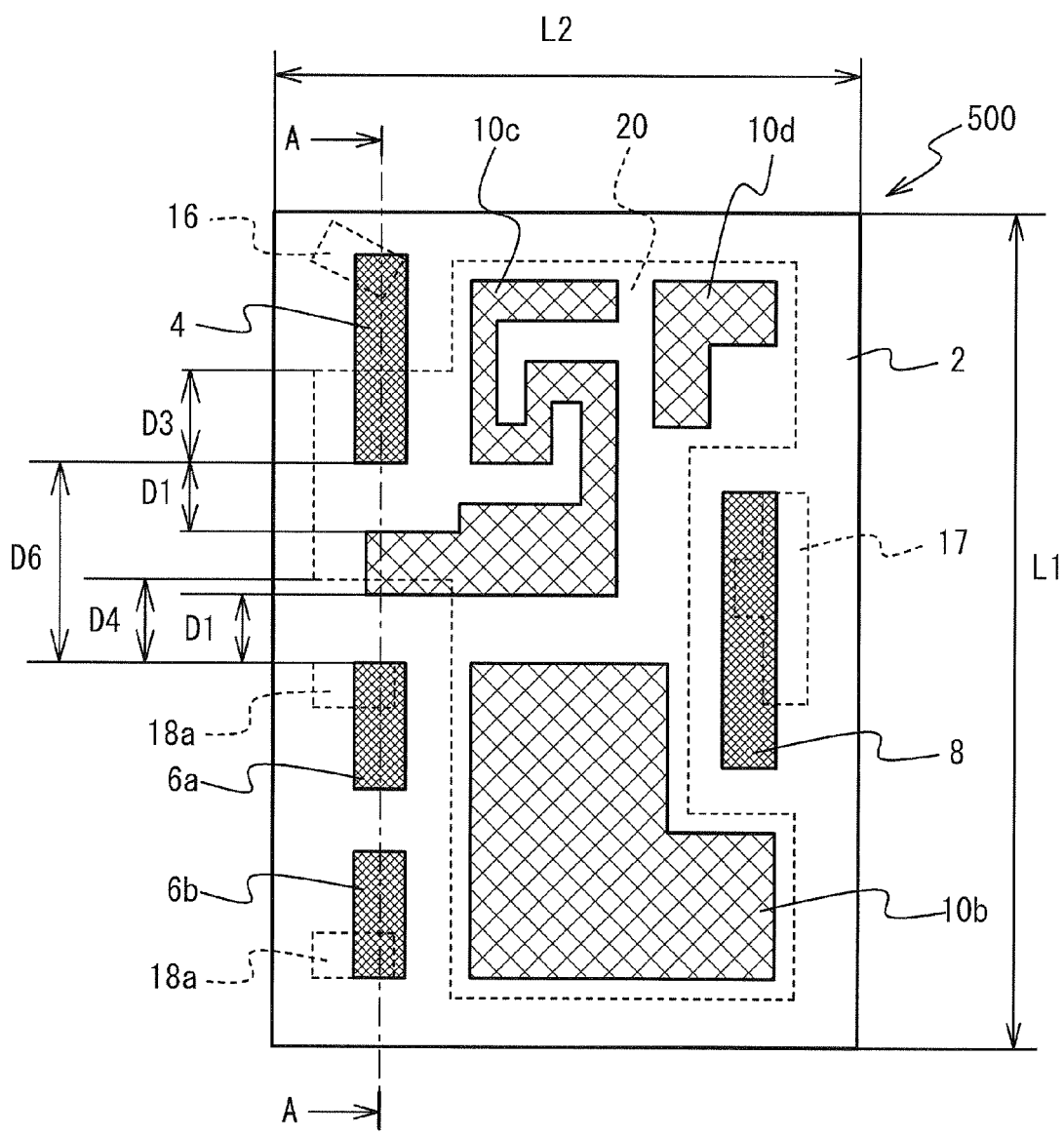
FIG. 12 is a plan view of a duplexer in accordance with a fourth embodiment.
Figure 13:
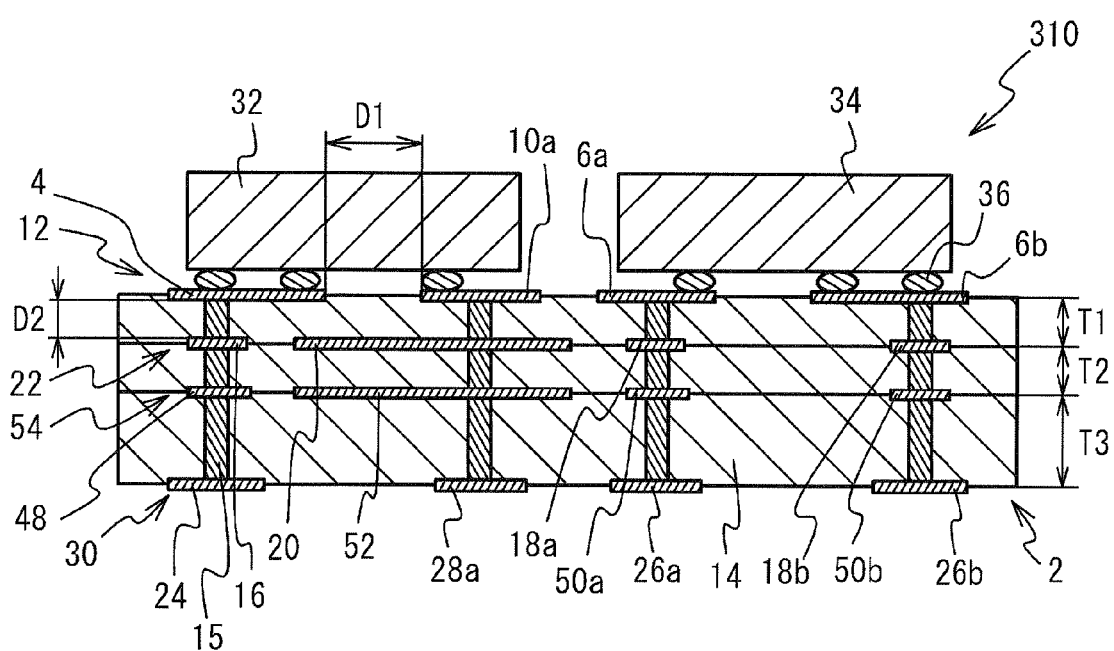
FIG. 13 is a cross-sectional view of the duplexer in accordance with the fourth embodiment.

A fourth embodiment has an exemplary structure in which the signal pads include balanced terminals. FIG. 12 is a plan view of a duplexer 500 in accordance with the fourth embodiment. FIG. 13 is a cross-sectional view taken along a line A-A in FIG. 12.

As illustrated in FIGS. 12 and 13, reception pads 6a and 6b in the upper interconnection layer 12 form balanced terminals. As illustrated in FIG. 13, one of the vias 15 connects the reception pad 6a in the upper interconnection layer 12, a reception pad 18a in the inner interconnection layer 22, a reception pad 50a in the inner interconnection layer 54 and a reception pad 26a in a lower interconnection layer 30. Similarly, the other one of the vias 15 connects the reception pads 6b, 18b, 50b and 26b.

As depicted in FIG. 12, the transmission pad 4 and the reception pads 6a and 6b are arranged in a line, and the upper ground pad 10c is interposed between the transmission pad 4 and the reception pad 6a.

As depicted in FIGS. 12 and 13, D1>T1. The inner ground pad 20 is located below the transmission pad 4. That is, the duplexer 500 is designed so that D1>D2 and D1>T1.

According to the fourth embodiment, since D1>D2 and D1>T1, it is possible to strengthen the signal coupling between the transmission pad 4 and the inner ground pad 20. It is thus possible to reduce the signal leakage between the transmission pad 4 and the reception pad 6a and that between the transmission pad 4 and the reception pad 6b. Since the inner ground pad 20 is positioned so as to overlap the transmission pad 4, D2 can further be reduced, as compared to the first embodiment. It is thus possible to further strengthen the signal coupling between the transmission pad 4 and the inner ground pad 20 and to improve the isolation between the signal pads. The signals having the mutually inverted phases can be obtained via the reception pad 26a and the reception pad 26b in the lower interconnection layer 30. Thus, the frequency characteristics of the duplexer can be improved.

A description will now be given of an experiment intended to measure the frequency characteristics of the signal received by the duplexer 500. The experiment measured the frequency characteristic of the duplexer 500 of the fourth embodiment and that of a duplexer 510 (comparative example) in which the reception pads are used to balanced terminals in the aforementioned duplexer 100.

Figure 14:
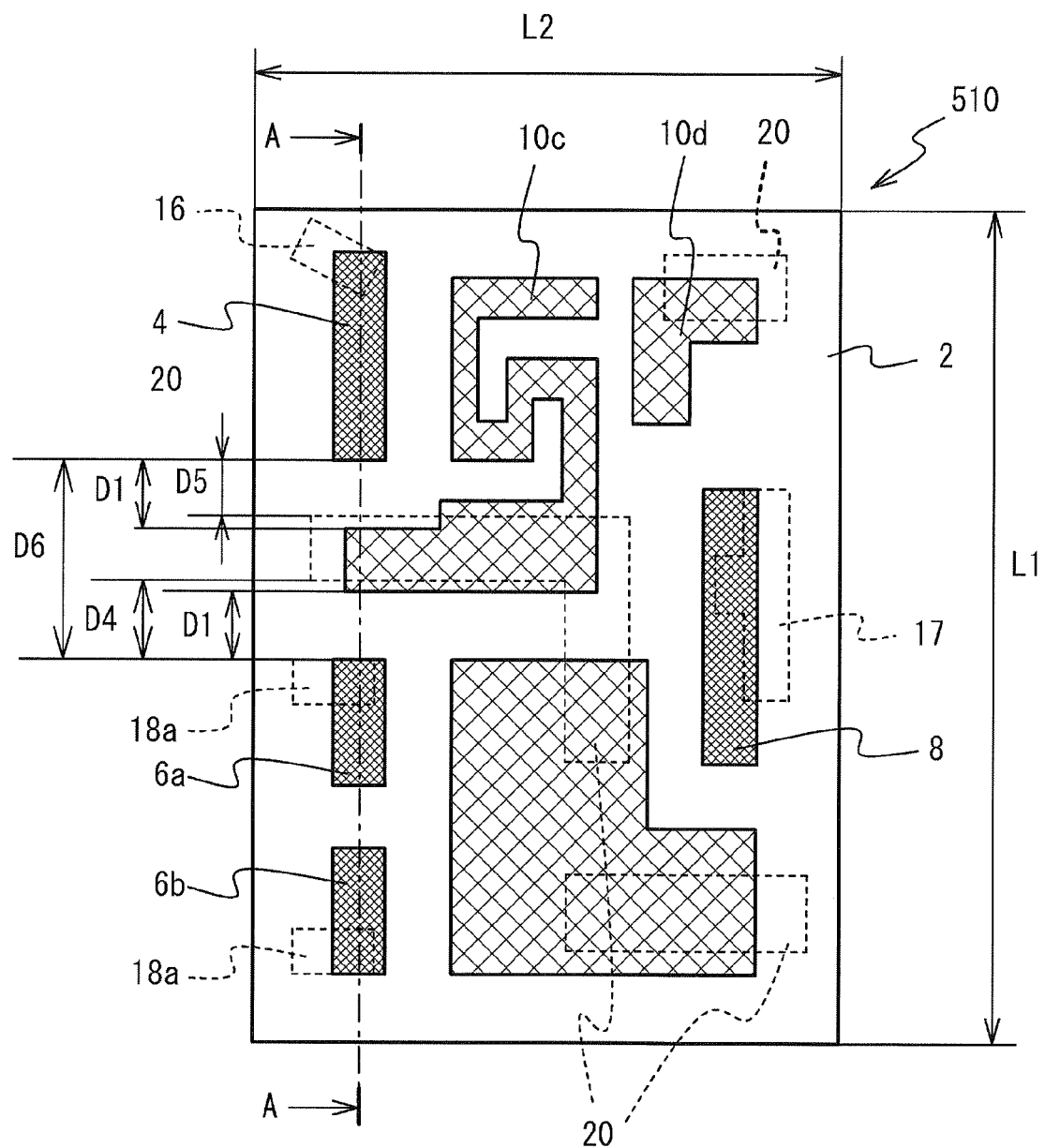
FIG. 14 is a plan view of a duplexer in accordance with a comparative example.

The duplexer 500 of the fourth embodiment has been described with reference to FIGS. 12 and 13. FIG. 14 is a plan view of the duplexer 510 to be compared with the duplexer 500, and FIG. 15 is a cross-sectional view taken along a line A-A illustrated in FIG. 14.

In the duplexers 500 and 510, the substrate 2 is made of alumina ceramic and has a relative permittivity of 9.8. The duplexers 500 and 510 have a longitudinal length L1 of 2.0 mm and a lateral length L2 of 1.6 mm (see FIGS. 12 and 14). The transmission filter chip 32 may be a ladder type SAW filter, and the reception filter chip 34 may be a double mode SAW filter. The transmission filter chip 32 and the reception filter chip 34 have mutually different pass bands. The pass band (transmission band) of the transmission filter chip 32 is located at a low-frequency side of the pass band (reception band) of the reception filter chip 34.

As illustrated in FIGS. 12 and 13, the duplexer 500 of the fifth embodiment has the following specifications. The minimum distance D1 between the transmission pad 4 and the upper ground pad 10b is 100 μm, and the minimum distance D2 between the transmission pad 4 and the inner ground pad 20 is 50 μm. A length D3 over which the transmission pad 4 and the inner ground pad 20 overlap each other is 205 μm. A minimum distance D4 between the inner ground pad 20 and the reception pad 18a is 110 μm. A minimum distance D6 between the transmission pad 4 and the reception pad 6a is 330 μm. The thickness T1 of the insulation layer 14 between the upper interconnection layer 12 and the inner interconnection layer 22 is 50 μm. The thickness T2 of the insulation layer 14 between the inner interconnection layer 22 and the inner interconnection layer 54 is 50 μm. The thickness T3 of the insulation layer 14 between the inner interconnection layer 54 and the lower interconnection layer 30 is 89 μm.

Figure 15:
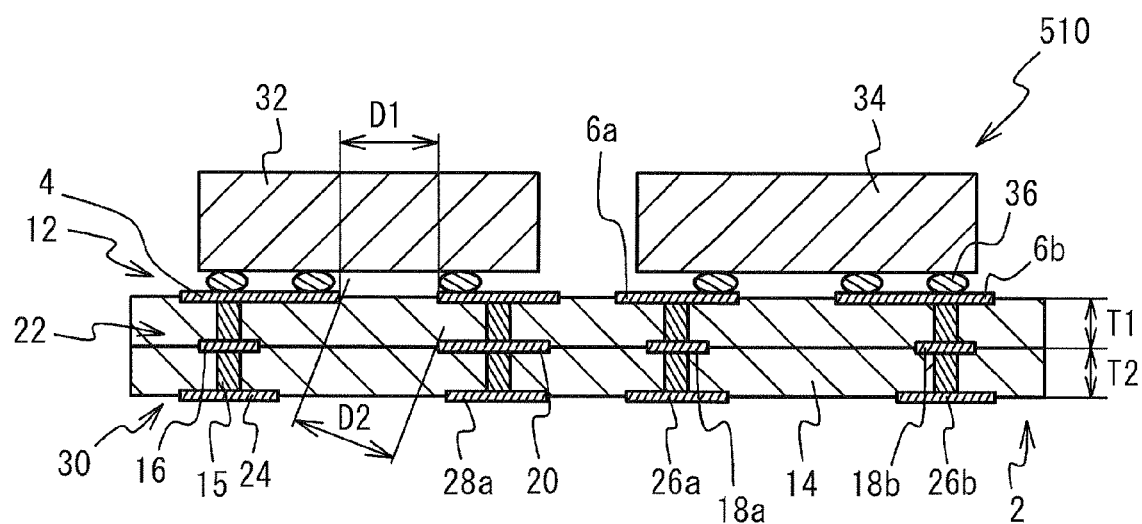
FIG. 15 is a cross-sectional view of the duplexer in accordance with the comparative example.

As illustrated in FIGS. 14 and 15, in the duplexer 510 of the comparative example, the reception pads 6a and 6b in the upper interconnection layer 12 function as balanced terminals. As depicted in FIG. 15, the reception pads 6a, 18a and 26a are connected by the via 15. Similarly, the reception pads 6b, 18b, 50b and 26b are connected by the via 15.

The duplexer 510 is configured so that D1=100 μm, D2=107 μm, D4=110 μm, D6=330 μm, T1=89 μm and T2=89 μm. A minimum distance D5 between a projected figure of the inner ground pad 20 on the upper surface of the base 2 and the transmission pad 4 is 60 μm.

Figure 16:
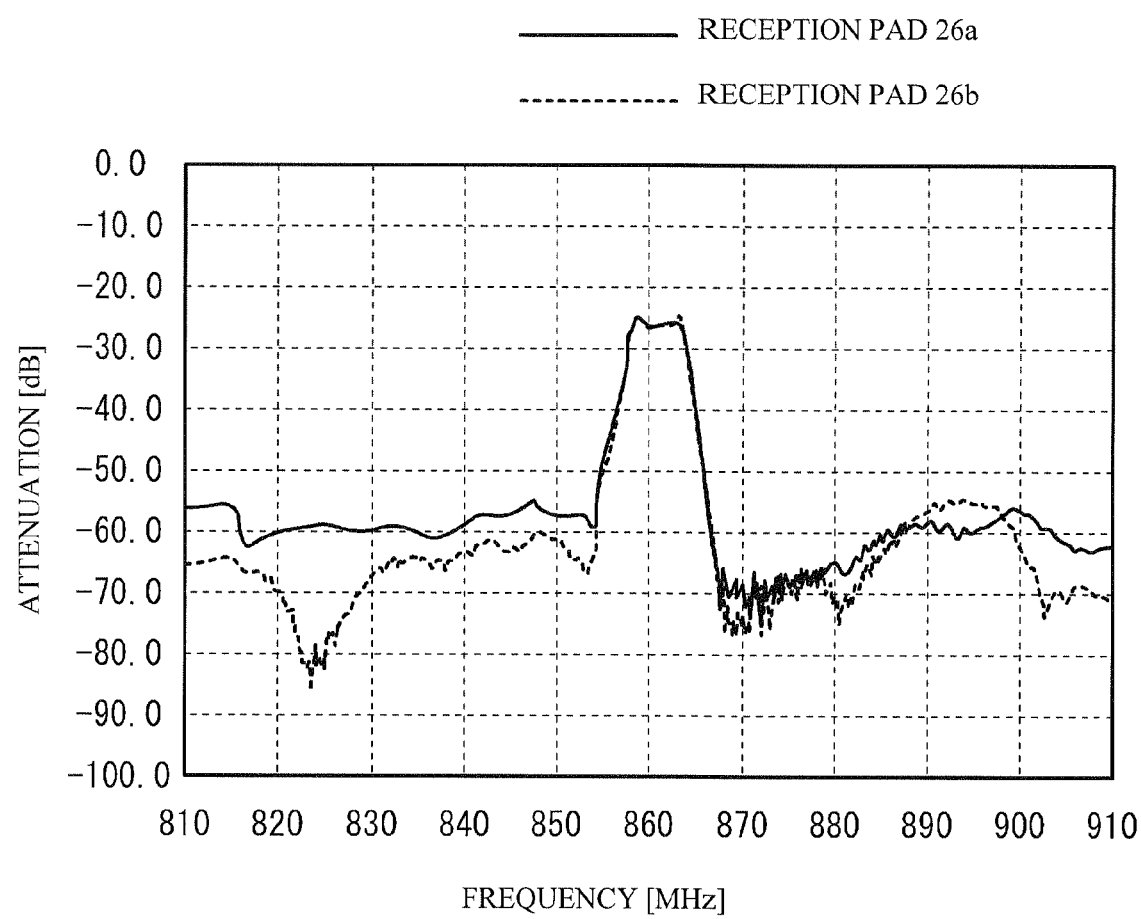
FIG. 16 is a graph of measurement results of an isolation characteristic of the comparative example obtained when reception pads are driven in an unbalanced way.

FIG. 16 is a graph of measurement results of isolation characteristics obtained by driving the reception pads 26a and 26b of the comparative example in the unbalanced way. The horizontal axis of the graph is the frequency and the vertical axis is the attenuation. In the graph, a solid line indicates the isolation characteristic between the transmission pad 24 and the reception pad 26a, and a broken line indicates the isolation characteristic between the transmission pad 24 and the reception pad 26b.

As illustrated in FIG. 16, the attenuation of the reception pad 26a becomes less than that of the reception pad 26b. The difference in attenuation is conspicuous at the low-frequency side at which the transmission band exits.

Figure 17:
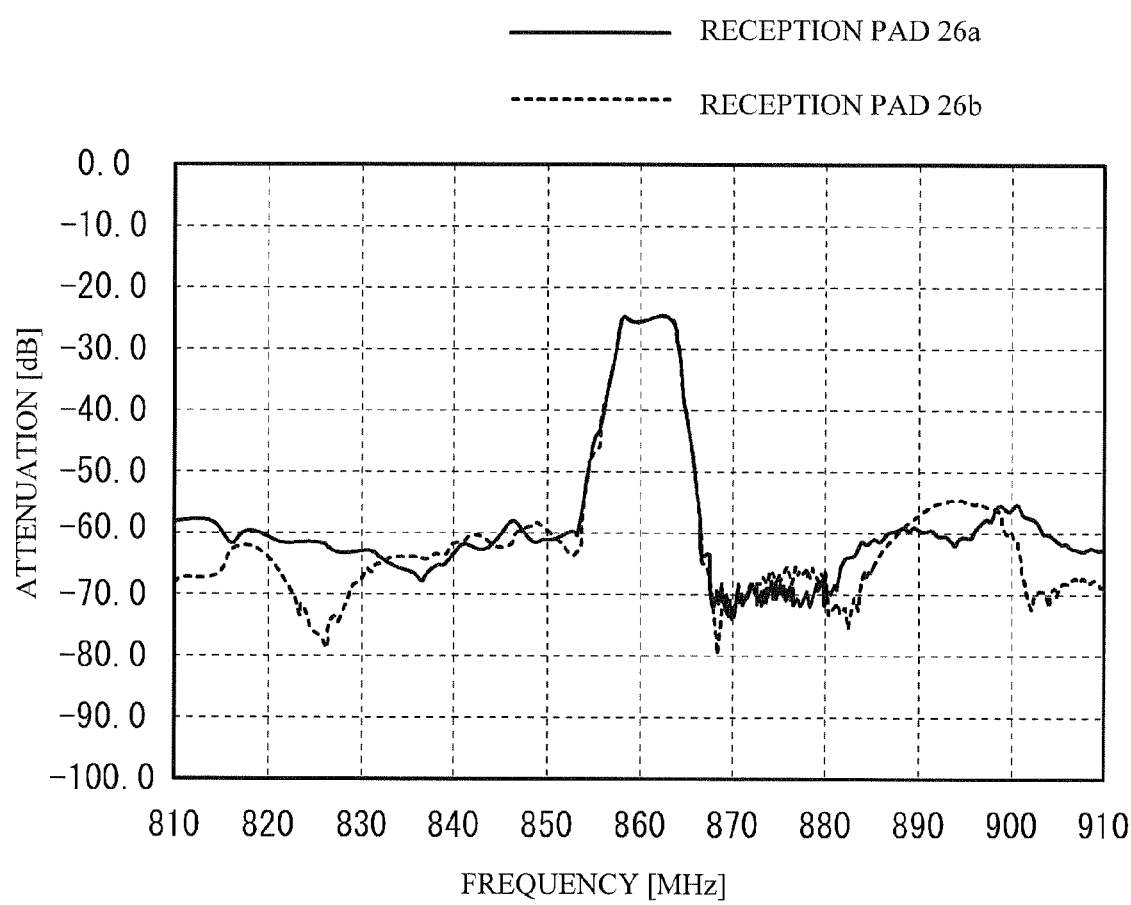
FIG. 17 is a graph of measurement results of an isolation characteristic of the fourth embodiment obtained when reception pads are driven in an unbalanced way.

Since D2>D1 in the comparative example, the signal leakage occurs between the transmission pad and the reception pad, and the isolation characteristic deteriorates. The distance between the transmission pad 4 and the reception pad 6a is less than the transmission pad 4 and the reception pad 6b. Thus, the signal coupling between the transmission pad 4 and the reception pad 6a is stronger than that between the transmission pad 4 and the reception pad 6b. That is, the signal that leaks from the transmission pad 4 to the reception pad 6a is stronger than the signal that leaks from the transmission pad 4 to the reception pad 6b. Thus, at the low-frequency side, there is a great difference in attenuation between the reception pad 6a and the reception pad 6b FIG. 17 is a graph of measurement results of isolation characteristics obtained by driving the reception pads 26a and 26b of the fourth embodiment in the unbalanced way. In FIG. 17, a solid line indicates the isolation characteristic between the transmission pad 24 and the reception pad 26a, and a broken line indicates the isolation characteristic between the transmission pad 24 and the reception pad 26b.

As illustrated in FIG. 17, the attenuation of the reception pad 26a in the transmission band is greater than that in the comparative example illustrated in FIG. 16, and the difference in attenuation between the reception pads 26a and 26b is less than that in the comparative example illustrated in FIG. 16.

Figure 18:
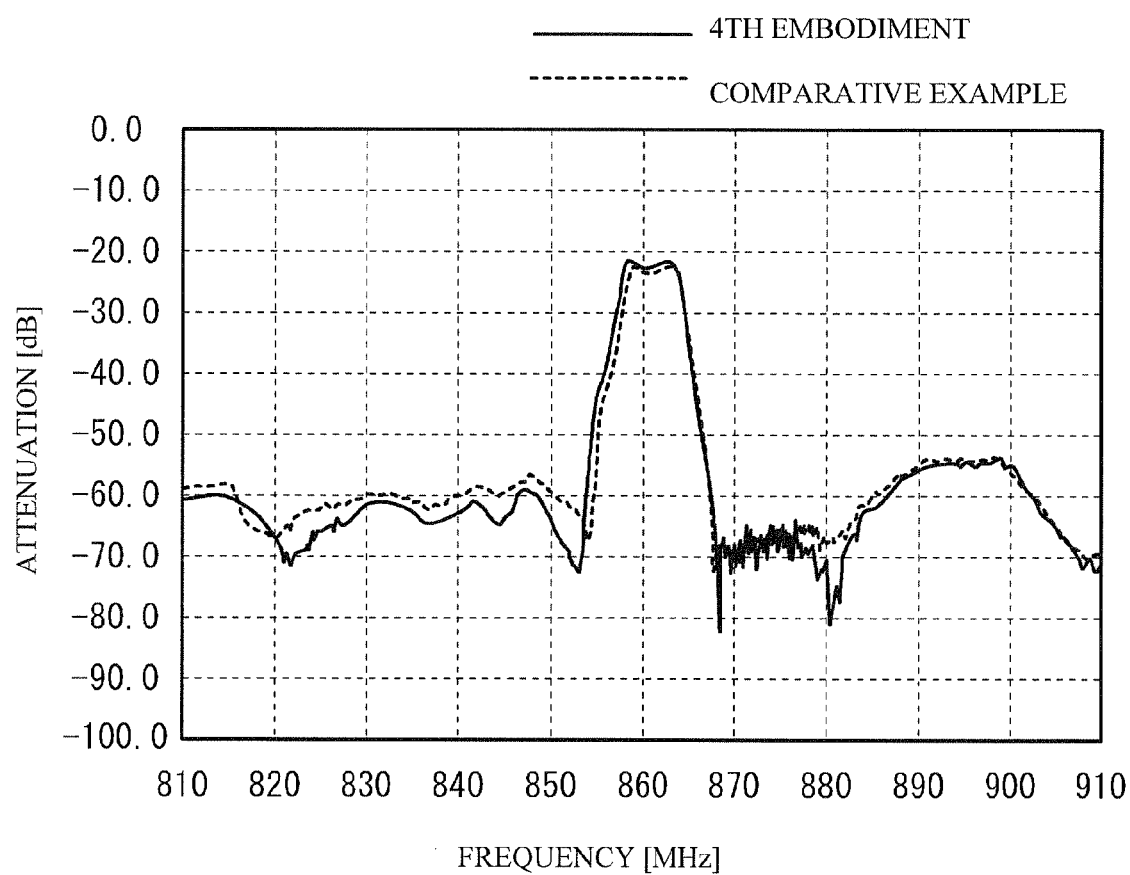
FIG. 18 is a graph of measurement results of frequency characteristics of the comparative example and the fourth embodiment in which reception pads are driven in a balanced way.

FIG. 18 is a graph of measurement results of frequency characteristics of the duplexers of the comparative example and the fourth embodiment obtained by driving the reception pads 26a and 26b in the balanced way. In the graph, a broken line indicates the frequency characteristic of the comparative example, and a solid line indicates the frequency characteristic of the fourth embodiment.

As illustrated in FIG. 18, the attenuation of the fourth embodiment is approximately 3 dB greater than that of the comparative example in the band of 820 MHz to 850 MHz, and is approximately 2 dB greater than that at a frequency around the 880 MHz.

According to the comparative example, the signal that leaks from the transmission pad 4 to the reception pad 6a is stronger than the signal that leaks from the transmission pad 4 to the reception pad 6b. This causes a difference in attenuation. Thus, even when the reception pads are driven in the balanced way, the signals are not canceled and the frequency characteristic of the duplexer is degraded.

In contrast, according to the fourth embodiment, D1>D2 and D1>T1. It is thus possible to strengthen the signal coupling between the transmission pad 4 and the inner ground pad 20. That is, it is possible to reduce the signal leakage between the transmission pad 4 and the reception pad 6a and the signal leakage between the transmission pad 4 and the reception pad 6b. Thus, the isolation characteristic between the signal pads can be improved in balance driving. As a result, as illustrated in FIG. 17, the leakage signals at the reception pads 6a and 6b are at almost the same levels. Thus, the signals are canceled in balance driving and the frequency characteristic of the duplexer can be improved.

Fifth Embodiment

Figure 19:
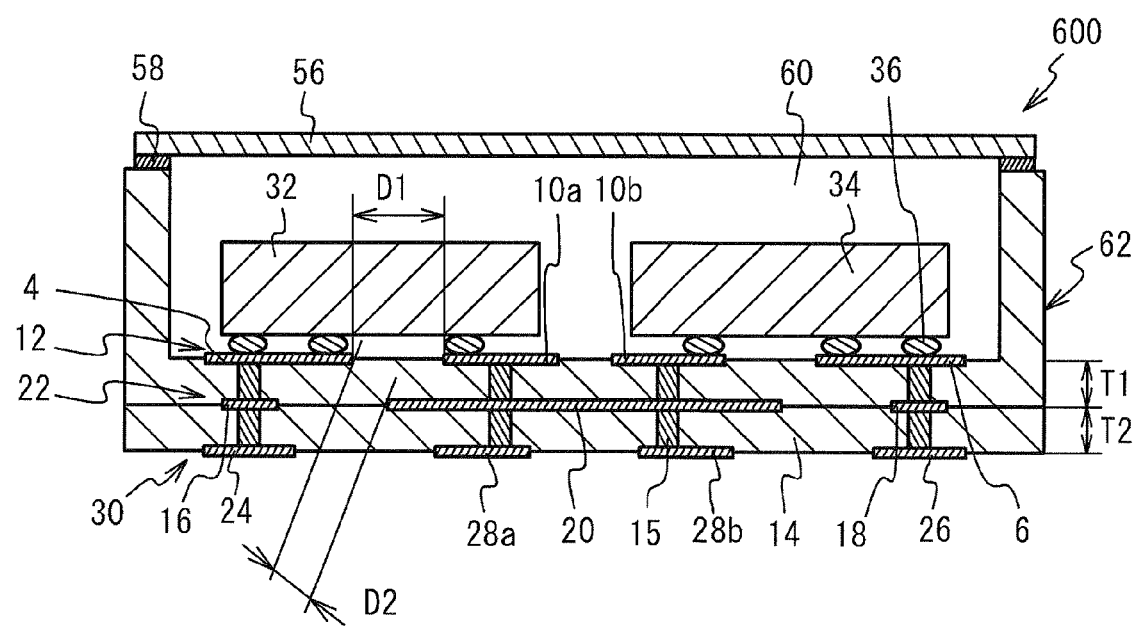
FIG. 19 is a cross-sectional view of a duplexer in accordance with a fifth embodiment.

A fifth embodiment has an exemplary structure in which a package having a cavity is used. FIG. 19 is a cross-sectional view of a duplexer 600 in accordance with the fifth embodiment. Parts that are the same as those described previously are given the same reference numerals, and a description thereof is omitted here.

As depicted in FIG. 19, a cavity 60 is formed on a substrate 62. The substrate 62 is composed of the insulation layer 14, the upper interconnection layer 12 exposed to the cavity 60, the lower interconnection layer 30 provided on the lower surface of the insulation layer 14, and the inner interconnection layer 22 provided within the substrate 62. The transmission filter chip 32 and the reception filter chip 34 are mounted in the cavity 60 over the substrate 62. The cavity 60 is sealed with a lid 56, which is fixed to the substrate 62 by an adhesive member 58 made of, for example, an Au—Sn alloy. According to the fifth embodiment, the acoustic wave filter chips are mounted in the cavity 60, which is sealed with the lid 56. Thus, the filter chips can be protected. In addition, the isolation characteristic between the transmission pad 4 and the reception pad 6 can be improved by D1>D2 and D1>T1.

Sixth Embodiment

Figure 20:
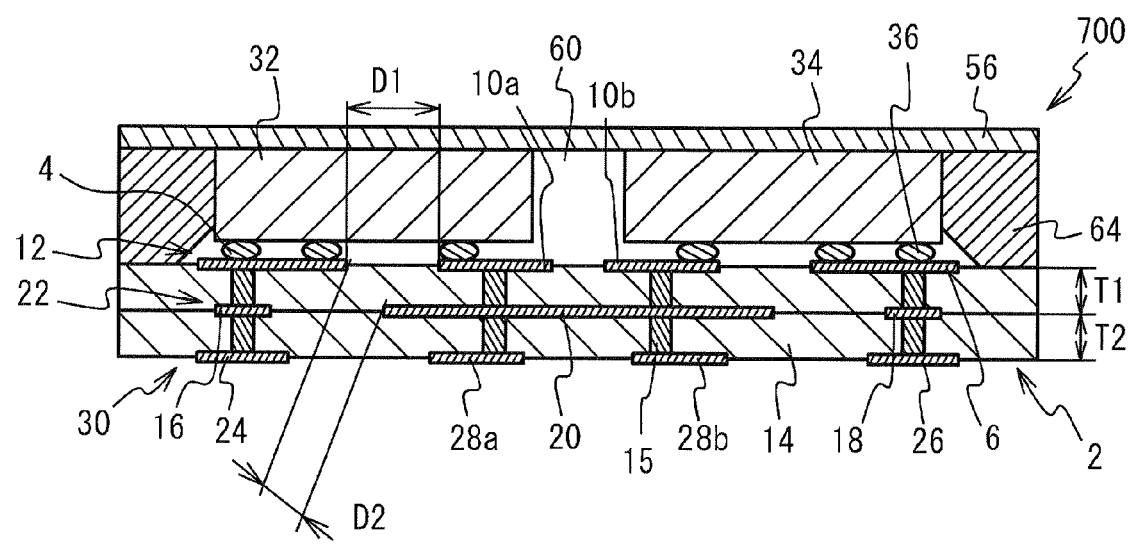
FIG. 20 is a cross-sectional view of a duplexer in accordance with a sixth embodiment.

A sixth embodiment is an exemplary structure using a seal member. FIG. 20 is a cross-sectional view of a duplexer 700 in accordance with the sixth embodiment. Parts that are the same as those described previously are given the same reference numerals.

As illustrated in FIG. 20, the transmission filter chip 32 and the reception filter chip 34 mounted on the upper surface of the substrate 2 are sealed with a seal member 64 made of, for example, solder and the lid 56. For the convenience' sake, FIG. 20 is illustrated so that the lid 56 contacts the upper surface of the transmission filter chip 32 and that of the reception filter chip 34. In actuality, a very small amount of the seal member 64 exits between the lid 56 and the upper surfaces of the transmission and reception filter chips 32 and 34. In the sealing step, the lid 56 is pressed against the seal member 64 provided on the upper surfaces of the filter chips and remains. In case where the transmission filter chip 32 and the reception filter chip 34 have different heights, a larger amount of the seal member 64 is provided on the upper surface of the filter chip having a smaller height. Thus, the difference in height between the filter chips is compensated for, and the lid 56 can be kept horizontally.

According to the sixth embodiment, the filter chips are sealed with the seal member 64 and the lid 56 and are thus protected. The isolation characteristic between the transmission pad 4 and the reception pad 6 can be improved by the arrangement of D1>D2 and D1>T1.

The lid 56 in FIG. 20 may be omitted so that the side and upper surfaces of the filter chips 32 and 34 are sealed with the seal member 64. In this case, the seal member 64 may be resin such as epoxy resin.

In the above-mentioned embodiments, two separate chips are used. A variation may use a single acoustic wave filter chip on which the acoustic wave transmission filter and the acoustic wave reception filter are formed. That is, at least one acoustic wave filter chip is used.

The filter chips 32 and 34 are not limited to the SAW filters but may be FBAR filters or acoustic boundary wave filters.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:
1. A duplexer comprising:
a substrate including an insulation layer, an upper interconnection layer provided on an upper surface of the insulation layer, a lower interconnection layer provided on a lower surface of the insulation layer, and an inner interconnection layer provided in the insulation layer, the inner interconnection layer including an inner ground pad;
at least one acoustic wave filter chip mounted on an upper surface of the substrate;
signal pads provided on the upper interconnection layer and connected to signal electrodes of the at least one acoustic wave filter chip; and
an upper ground pad that is provided in the upper interconnection layer so as to be located between the signal pads and is connected to a ground electrode of the at least one acoustic wave filter,
wherein D1>D2 and D1>T1 where D1 is a minimum distance between the signal pads and the upper ground pad, D2 is a minimum distance between the signal pads and the inner ground pad, and T1 is a thickness of the insulation layer between the upper interconnection layer and the inner interconnection layer.
2. The duplexer according to claim 1, wherein:
the at least one acoustic filter chip includes a reception filter chip and a transmission filter chip, each of which is equipped with the signal electrodes and the ground electrode;
the signal pads includes a reception pad connected to a corresponding one of the signal electrodes of the recep- tion filter chip, and a transmission pad connected to a corresponding one of the signal electrodes of the transmission filter chip; and the upper interconnection layer includes a common terminal connected to corresponding ones of the signal electrodes of the reception and transmission filter chips.

3. The duplexer according to claim 1, wherein the inner ground pad is located at a position where the inner ground pad overlaps the signal pads.

4. The duplexer according to claim 1, wherein the signal pads include balanced terminals.

5. The duplexer according to claim 1, wherein T1<T2 where T2 is a thickness of the insulation layer between the inner interconnection layer and the lower interconnection layer.

6. The duplexer according to claim 1, wherein the duplexer includes another inner interconnection layer between the inner interconnection layer and the lower interconnection layer.

7. The duplexer according to claim 1, wherein the duplexer includes an interconnection pattern that is provided on the upper interconnection layer and functions as an inductance.

8. The duplexer according to claim 1, wherein the at least one acoustic wave filter chip is mounted in a cavity formed in the substrate, and the duplexer includes a lid with which the cavity is sealed.

9. The duplexer according to claim 1, wherein the at least one acoustic wave filter chip is sealed with a seal member.

* * * * *